(12) United States Patent
Kim et al.

(10) Patent No.: US 10,103,018 B2
(45) Date of Patent: Oct. 16, 2018

(54) APPARATUS FOR TREATING SUBSTRATE

(71) Applicant: Semes Co., Ltd., Cheonan-si, Chungcheongnam-do (KR)

(72) Inventors: Hyung Joon Kim, Pyeongtaek-si (KR); Seung Pyo Lee, Seoul (KR); Hyung Je Woo, Seongnam-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 85 days.

(21) Appl. No.: 13/953,009

(22) Filed: Jul. 29, 2013

(65) Prior Publication Data

US 2014/0034240 A1    Feb. 6, 2014

(30) Foreign Application Priority Data

Jul. 31, 2012    (KR) .................. 10-2012-0084128
Dec. 27, 2012    (KR) .................. 10-2012-0154514

(51) Int. Cl.
*H01J 1/32*    (2006.01)
*C23C 16/44*    (2006.01)
(Continued)

(52) U.S. Cl.
CPC ........ *H01L 21/02* (2013.01); *H01J 37/32633* (2013.01); *H01J 37/32834* (2013.01); *C23C 16/4412* (2013.01)

(58) Field of Classification Search
CPC ..... C30B 25/14; C23C 16/455; C23C 16/507; C23C 16/509; C23C 16/4412;
(Continued)

(56) References Cited

U.S. PATENT DOCUMENTS 5,891,350 A  *  4/1999  Shan ................. H01J 37/32477
                                                    118/723 E
6,051,100 A     4/2000  Walko, II
                        (Continued)

FOREIGN PATENT DOCUMENTS

CN        1 461 494 A      12/2003
CN      2015-14924 U        6/2010
                (Continued)

*Primary Examiner* — Gordon R Baldwin
*Assistant Examiner* — Mirza Israr Javed
(74) *Attorney, Agent, or Firm* — Harness, Dickey & Pierce, P.L.C.

(57) ABSTRACT

Provided is a substrate treatment apparatus using plasma. The substrate treatment apparatus includes a housing having an inner space in which a substrate is treated, a support member disposed within the housing to support the substrate, a gas supply unit supplying a gas into the housing, a plasma source generating plasma from the gas supplied into the housing, and a baffle unit disposed to surround the support member within the housing, the baffle unit including a baffle in which through holes for exhausting the gas into the inner space of the housing are defined. The baffle is divided into a plurality of areas when viewed from an upper side, and each of portions of the plurality of areas is formed of a metallic material, and each of the other portions of the plurality of areas is formed of a nonmetallic material.

12 Claims, 7 Drawing Sheets

(51) Int. Cl.
*H01L 21/02* (2006.01)
*H01J 37/32* (2006.01)

(58) Field of Classification Search
CPC ............ C23C 16/4401; C23C 16/5096; C23C 16/45561; C23C 16/45565; H01J 37/321; H01J 37/3244; H01J 37/32082; H01J 37/32174; H01J 37/32623; H01J 37/32834; H01L 21/67017; H01L 21/67069
USPC ................. 118/715, 723 R, 723 E, 723 I; 156/345.29
See application file for complete search history.

(56) References Cited

U.S. PATENT DOCUMENTS

| | | | | |
|---|---|---|---|---|
| 6,178,919 | B1 * | 1/2001 | Li ..................... | H01J 37/32165 118/723 E |
| 6,726,801 | B2 * | 4/2004 | Ahn .................. | H01J 37/32633 156/345.29 |
| 6,733,620 | B1 | 5/2004 | Sugiyama et al. | |
| 2004/0129218 | A1 * | 7/2004 | Takahashi ......... | H01J 37/32834 118/715 |
| 2005/0167052 | A1 * | 8/2005 | Ishihara ............ | H01J 37/32834 156/345.47 |
| 2006/0118044 | A1 * | 6/2006 | Himori ............. | H01J 37/32082 118/723 E |
| 2007/0085483 | A1 * | 4/2007 | Ni ....................... | C23C 16/4404 315/111.71 |
| 2008/0011424 | A1 * | 1/2008 | Yin ................... | H01J 37/32091 156/345.48 |
| 2009/0025878 | A1 * | 1/2009 | Rauf ................. | H01J 37/16 156/345.48 |
| 2009/0236043 | A1 * | 9/2009 | Matsudo ........... | H01J 37/32091 156/345.43 |
| 2010/0140085 | A1 | 6/2010 | Sato et al. | |
| 2010/0243608 | A1 * | 9/2010 | Koshimizu ....... | H01J 37/32091 216/67 |
| 2011/0214814 | A1 * | 9/2011 | Iizuka .............. | C23F 1/08 156/345.34 |

FOREIGN PATENT DOCUMENTS

| | | |
|---|---|---|
| CN | 101 853 765 A | 10/2010 |
| JP | 2010186949 A | 8/2010 |
| KR | 1020070083779 A | 11/2009 |
| KR | 100992392 B1 | 11/2010 |
| KR | 101061657 B1 | 9/2011 |

* cited by examiner

APPARATUS FOR TREATING SUBSTRATE

CROSS-REFERENCE TO RELATED APPLICATIONS

This U.S. non-provisional patent application claims priority under 35 U.S.C. § 119 of Korean Patent Application Nos. 10-2012-0084128, filed on Jul. 31, 2012, and 10-2012-0154514, filed on Dec. 27, 2012, the entire contents of which are hereby incorporated by reference.

BACKGROUND OF THE INVENTION

The present invention disclosed herein relates to an apparatus for treating a substrate, and more particularly, to an apparatus for treating a substrate by using plasma.

To manufacture semiconductor devices, various processes such as a photolithography process, an etching process, an ashing process, an ion-injection process, a thin film deposition process, and a cleaning process may be performed on a substrate to form a desired pattern on the substrate. Among these processes, the etching process may be performed to remove an area selected in a layer formed on the substrate. The etching process may include a wet etching process and a dry etching process.

Here, an etching device using plasma may be used to perform the dry etching process. In general, a magnetic field may be formed within a chamber to from plasma. The magnetic field may excite a process gas provided into the chamber in a plasma state.

Plasma represents an ionized gas containing ions, electrons, and radicals. Plasma may be generated by a very high temperature, strong electric fields, or electromagnetic fields (EF). Ion particles contained in plasma collide with a substrate to perform the etching process.

The plasma does not exist in only a direct upper side of the substrate within the chamber, but is diffused in various directions. Particularly, if a large amount of plasma is diffused into an edge region within the chamber, a substrate treatment process may be deteriorated in efficiency.

SUMMARY OF THE INVENTION

The present invention provides a substrate treatment apparatus which is capable of concentrating plasma within a chamber into a central region in which a substrate is disposed in a substrate treatment process using the plasma.

The present invention also provides a substrate treatment apparatus which is capable of preventing arching from occurring when a fluid is exhausted into a chamber through a baffle.

The feature of the present invention is not limited to the aforesaid, but other features not described herein will be clearly understood by those skilled in the art from descriptions below.

Embodiments of the present invention provide substrate treatment apparatuses.

The substrate treatment apparatuses include: a housing having an inner space in which a substrate is treated; a support member disposed within the housing to support the substrate; a gas supply unit supplying a gas into the housing; a plasma source generating plasma from the gas supplied into the housing; and a baffle unit disposed to surround the support member within the housing, the baffle unit including a baffle in which through holes for exhausting the gas into the inner space of the housing are defined, wherein the baffle is divided into a plurality of areas when viewed from an upper side, and each of portions of the plurality of areas is formed of a metallic material, and each of the other portions of the plurality of areas is formed of a nonmetallic material.

In some embodiments, the through holes may be defined in a boundary between each of the metallic material areas and each of the nonmetallic material areas.

In other embodiments, the plurality of areas may be concentrically disposed, and each of the plurality of areas may have a ring shape.

In still other embodiments, the metallic material areas may be disposed on both sides of each of the nonmetallic material areas.

In even other embodiments, the metallic material areas and the nonmetallic material areas may be alternately repeatedly provided.

In yet other embodiments, portions of the plurality of areas may have thicknesses different from each other.

In further embodiments, each of the plurality of areas may have a thickness gradually increasing from a central area to an edge area thereof.

In still further embodiments, top surfaces of plurality of the areas may be combined with each other to provide a rounded shape.

In even further embodiments, each of plurality of the areas may have a thickness gradually increasing from a central area to an edge area thereof.

In yet further embodiments, the nonmetallic material may include a dielectric substance.

In much further embodiments, the baffle unit may further include a baffle grounding plate having a top surface contacting a bottom surface of the baffle, the baffle grounding plate being connected to the housing to ground the baffle.

In still much further embodiments, the substrate treatment apparatuses may further include a plasma induction member disposed on a top surface of the housing, the plasma induction member having a thickness gradually increasing toward an edge area thereof.

In even much further embodiments, the plasma induction member may have a bottom surface with a rounded shape.

In yet much further embodiments, the substrate treatment apparatuses may further include a plasma induction member disposed on a top surface of the housing, the plasma induction member having a thickness gradually increasing toward an edge area thereof.

Other embodiments of the present invention provide baffle units.

The baffle units include: a baffle in which through holes for exhausting a gas into a space in which a substrate is treated are defined; a grounding plate contacting the baffle to ground the baffle, wherein the baffle is divided into a plurality of areas when viewed from an upper side, and portions of the plurality of areas are provided as metallic material areas, and the other portions of the plurality of areas are provided as nonmetallic material areas.

In some embodiments, the through holes may be defined in a boundary between each of the metallic material areas and each of the nonmetallic material areas.

In other embodiments, the metallic material areas and the nonmetallic material areas may be concentrically disposed, and each of the plurality of areas may have a ring shape.

In still other embodiments, the metallic material areas and the nonmetallic material areas may be alternately repeatedly provided.

In even other embodiments, portions of the plurality of areas may have thicknesses different from each other.

In yet other embodiments, each of the plurality of areas may have a thickness gradually increasing from a central area to an edge area thereof.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
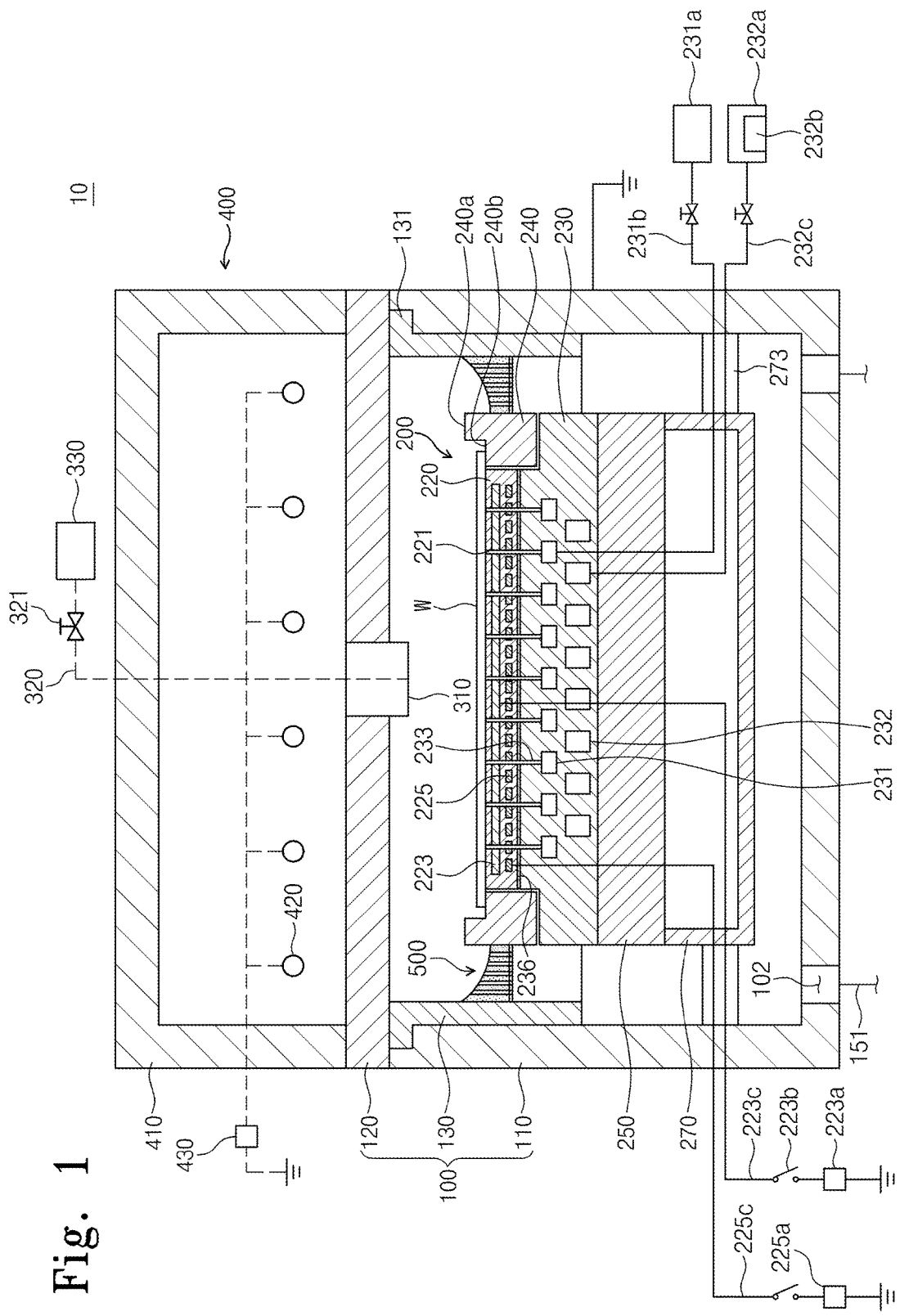
FIG. 1 is a cross-sectional view of a substrate treatment apparatus according to an embodiment of the present invention.

The present invention may, however, be embodied in different forms and should not be constructed as limited to the embodiments set forth herein. Rather, these embodiments are provided so that this disclosure will be thorough and complete, and will fully convey the scope of the present invention to those skilled in the art. In the drawings, the thicknesses of layers and regions are exaggerated for clarity.

FIG. 1 is a cross-sectional view of a substrate treatment apparatus according to an embodiment of the present invention.

Referring to FIG. 1, a substrate treatment apparatus 10 treats a substrate W by using plasma. For example, the substrate treatment apparatus 10 may perform an etching process on the substrate W. The substrate treatment apparatus 10 includes a chamber 100, a support member 200, a gas supply unit 300, a plasma source 400, and a baffle unit 500.

The chamber 100 provides a space in which a substrate treatment process is performed. The chamber 100 includes a housing 110, a sealing cover 120, and a liner 130.

The housing 110 has an inner space with an opened upper surface. The inner space of the housing 110 is provided as a space in which the substrate treatment process is performed. The housing 110 is formed of a metallic material. The housing 110 may be formed of an aluminum material. The housing 110 may be grounded. An exhaust hole 102 is defined in a bottom surface of the housing 110. The exhaust hole 102 is connected to an exhaust line 151. Reaction byproducts generated during the process and gases staying in the housing 110 may be exhausted to the outside through the exhaust line 151. Also, the inner space of the housing 110 is decompressed to a predetermined pressure by the exhausting process.

The sealing cover 120 covers the opened upper surface of the housing 110. The sealing cover 120 may be provided in a plate shape to seal the inner space of the housing 110. The sealing cover 120 may include a dielectric substance window.

The liner 130 is disposed within the housing 110. The liner 130 has an inner space with opened top and bottom surfaces. The liner 130 may have a cylindrical shape. The liner 130 may have a radius corresponding to that of an inner surface of the housing 110. The liner 130 may be disposed along the inner surface of the housing 110. A support ring 131 is disposed on an upper end of the liner 130. The support ring 131 may be provided as a plate having a ring shape. The support ring 131 protrudes outward from the liner 130 along a circumference of the liner 130. The support ring 131 is disposed on an end of the upper housing 110 to support the liner 130. The liner 130 and the housing 110 may be formed of the same material. The liner 130 may be formed of an aluminum material. The liner 130 protects the inner surface of the housing 110. When a process gas is excited, arc discharge may occur within the chamber 100. The arc discharge may damage peripheral devices. The liner 130 may protect the inner surface of the housing 110 to prevent the inner surface of the housing 110 from being damaged by the arc discharge. Also, the liner 130 may prevent impurities generated during the substrate treatment process from being deposited on an inner sidewall of the housing 110. The liner 130 may be inexpensive in manufacturing cost and easily replaced when compared to those of the housing 110. When the liner 130 is damaged by the arc discharge, a worker may replace the damaged liner 130 with a new liner 130.

The support member 200 is disposed within the housing 110. The support member 200 supports the substrate W. The support member 200 may include an electrostatic chuck 210 for absorbing the substrate W by using an electrostatic force. Alternatively, the support member 200 may support the substrate W through various methods such as mechanical clamping. Hereinafter, the support member 200 including the electrostatic chuck 210 will be described.

The support member 200 includes the electrostatic chuck 210, an insulation plate 250, and a lower cover 270. The support member 200 is spaced upward from the bottom surface of the housing 110 within the chamber 100.

The electrostatic chuck 210 includes a dielectric plate 220, an electrode 223, a heater 225, a support plate 230, and a focus ring 240.

The dielectric plate 220 is disposed on an upper end of the electrostatic chuck 210. The dielectric plate 220 has a circular shape and is formed of a dielectric substance. The substrate W is placed on a top surface of the dielectric plate 220. The top surface of the dielectric plate 220 has a radius less than that of the substrate W. Thus, the substrate W may have an edge area disposed outside the dielectric plate 220. A first supply passage 221 is defined in the dielectric plate 220. The first supply passage 221 is defined from the top surface up to a bottom surface of the dielectric plate 220. The first supply passage 221 may be provided in plurality. Also, the plurality of first supply passages 221 are spaced apart from each other. The first supply passage 221 serves as a passage through which a thermal transfer medium is supplied to a bottom surface of the substrate W.

The lower electrode 223 and the heater 225 are buried in the dielectric plate 220. The lower electrode 223 is disposed above the heater 225. The lower electrode 223 is electrically connected to a first lower power source 223a. The first lower power source 223a may include a DC power source. A switch 223b is disposed between the lower electrode 223 and the first lower power source 223a. The lower electrode 223 may be electrically connected to the first lower power source 223a through an ON/OFF operation of the switch 223b. When the switch 223b is turned on, DC current is applied into the lower electrode 223. The electrostatic force may act between the lower electrode 223 and the substrate W by the current applied into the lower electrode 223. Thus, the substrate W may be absorbed to the dielectric plate 220 by the electrostatic force.

The heater 225 is electrically connected to a second lower power source 225a. The heater 225 may be resisted against current applied from the second lower power source 225a to generate heat. The generated heat may be transferred into the substrate W through the dielectric plate 220. The substrate W may be maintained at a predetermined temperature by the heat generated in the heater 225. The heater 225 includes a spiral coil.

The support plate 230 is disposed under the dielectric plate 220. A bottom surface of the dielectric plate 220 and a top surface of the support plate 230 may adhere to each other by using an adhesive 236. The support plate 230 may be formed of an aluminum material. The support plate 230 may have a stepped portion so that a central area of the top surface thereof is disposed at a height greater than that of an edge area thereof. The central area of the top surface of the support plate 230 has a surface area corresponding to that of the bottom surface of the dielectric plate 220 and adheres to the bottom surface of the dielectric plate 220. A first circulation passage 231, a second circulation passage 232, and a second supply passage 233 are defined in the support plate 230.

The first circulation passage 231 provides a passage through which the thermal transfer medium is circulated. The first circulation passage 231 may be defined in a spiral shape within the support plate 230. Alternatively, the first circulation passage 231 may be provided so that ring-shaped passages having radii different from each other are concentrically disposed. In this case, the first circulation passages 231 may communicate with each other. The first circulation passages 231 may be defined at the same height.

The second circulation passage 232 provides a passage through which a cooling fluid is circulated. The second circulation passage 232 may have defined in a spiral shape within the support plate 230. Alternatively, the second circulation passage 232 may be provided so that ring-shaped passages having radii different from each other are concentrically disposed. In this case, the second circulation passages 232 may communicate with each other. The second circulation passage 232 may have a sectional area greater than that of the first circulation passage 231. The first circulation passages 232 may be defined at the same height. The second circulation passage 232 may be defined under the first circulation passage 231.

The second supply passage 233 extends upward from the first circulation passage 231 up to the top surface of the support plate 230. The second supply passage 233 may be provided in number corresponding to that of the first supply passage 221. The second supply passage 233 connects the first circulation passage 231 to the first supply passage 221.

The first circulation passage 231 is connected to a thermal transfer medium storage unit 231a through a thermal transfer medium supply line 231b. The thermal transfer medium is stored in the thermal transfer medium storage unit 231a. The thermal transfer medium includes an inert gas. According to an embodiment, the thermal transfer medium may include a helium (He) gas. The helium gas is supplied into the first circulation passage 231 through the thermal transfer medium supply line 231b. Then, the helium gas successively passes through the second supply passage 233 and the first supply passage 221 and then is supplied to the bottom surface of the substrate W. The helium gas may serve as a medium for transferring heat transferred from the plasma to the substrate W toward the electrostatic chuck 210.

The second circulation passage 232 is connected to a cooling fluid storage unit 232a through a cooling fluid supply line 232c. The cooling fluid is stored in the cooling fluid storage part 232a. A cooler 232b may be disposed within the cooling fluid storage unit 232a. The cooler 232b cools the cooling fluid to a predetermined temperature. Alternatively, the cooler 232b may be disposed on the cooling fluid supply line 232c. The cooling unit supplied into the second circulation passage 232 through the cooling fluid supply line 232c is circulated along the second circulation passage 232 to cool the support plate 230. While the support plate 230 is cooled, the dielectric plate 220 and the substrate W may be cooled together to maintain the substrate W at a predetermined temperature.

The focus ring 240 is disposed on an edge area of the electrostatic chuck 210. The focus ring 240 has a ring shape and is disposed along a circumference of the dielectric plate 220. The focus ring 240 may have a stepped portion so that an outer portion 240a of a top surface thereof is disposed at a height greater than that of an inner portion 240b of the top surface. An inner portion 240b of the top surface of the focus ring 240 is disposed at the same height as that of the dielectric plate 220.

The inner portion 240b of the top surface of the focus ring 240 supports the edge area of the substrate W disposed outside the dielectric plate 220. The outer portion 240a of the focus ring 240 surrounds the edge area of the substrate W. The focus ring 240 may focus the plasma into a region facing the substrate W within the chamber 100.

The insulation plate 250 is disposed under the support plate 230. The insulation plate 250 has a sectional area corresponding to that of the support plate 230. The insulation plate 250 is disposed between the support plate 230 and the lower cover 270. The insulation plate 250 is formed of an insulation material to electrically insulate the support plate 230 from the lower cover 270.

The lower cover 270 is disposed on a lower end of the support member 200. The lower cover 270 is spaced upward from the bottom surface of the housing 110. The lower cover 270 has an inner space with an opened top surface. The top surface of the lower cover 270 is covered by the insulation plate 250. Thus, an external radius in a sectional area of the lower cover 270 may have the same length as that of the insulation plate 250. A lift pin module (not shown) for moving the carried substrate W from an external carrying member to the electrostatic chuck 210 may be disposed in the inner space of the lower cover 270.

The lower cover 270 includes a connection member 273. The connection member 273 connects an outer surface of the lower cover 270 to the inner sidewall of the housing 110. The connection member 273 may be provided in plurality. The plurality of connection members 273 may be disposed on the outer surface of the lower cover 270 at a predetermined distance. The connection member 273 supports the support member 200 inside the chamber 100. Also, the connection member 273 may be connected to the inner sidewall of the housing 110 to allow the lower cover to be electrically grounded. A first power line 223c connected to the first lower power source 223a, a second power line 225c connected to the second lower power source 225a, the thermal transfer supply line 231b connected to the thermal transfer medium storage unit 231a, and the cooling fluid supply line 232c connected to the cooling fluid storage unit 232a may extend into the lower cover 270 through an inner space of the connection member 273.

The gas supply unit 300 supplies the process gas into the chamber 100. The gas supply unit 300 includes a gas supply nozzle 310, a gas supply line 320, and a gas storage unit 330. The gas supply nozzle 310 is disposed at a central portion of the sealing cover 120. An injection hole is defined in a bottom surface of the gas supply nozzle 310. The injection hole is defined in a lower portion of the sealing cover 120 to supply the process gas into the chamber 100. The gas supply line 320 connects the gas supply nozzle 310 to the gas storage unit 330. The gas supply line 320 supplies the process gas stored in the gas storage unit 330 into the gas supply nozzle 310. A valve 321 is disposed in the gas supply line 320. The valve 321 opens or closes the gas supply line 320 to adjust a flow rate of the process gas supplied through the gas supply line 320.

The plasma source 400 excites the process gas within the chamber 100 into a plasma state. An inductively coupled plasma (ICP) source may be used as the plasma source 400. The plasma source 400 includes an antenna chamber 410, an antenna 420 and a plasma power source 430. The antennal chamber 410 has a cylindrical shape with an opened lower side. The antennal chamber 410 has an inner space. The antennal chamber 410 may have a diameter corresponding to that of the chamber 100. The antennal chamber 410 may have a lower end detachably disposed on the sealing cover 120. The antenna 420 is disposed inside the antenna chamber 410. The antenna 420 may be provided as a spiral coil that is wound several times. The antenna 420 is connected to the plasma power source 430. The antenna 420 receives a power from the plasma power source 430. The plasma power source 430 may be disposed outside the chamber 100. The antennal 420 to which the power is applied may generate electromagnetic fields in a processing space of the chamber 100. The process gas is excited into the plasma state by the electromagnetic fields.

Figure 2:
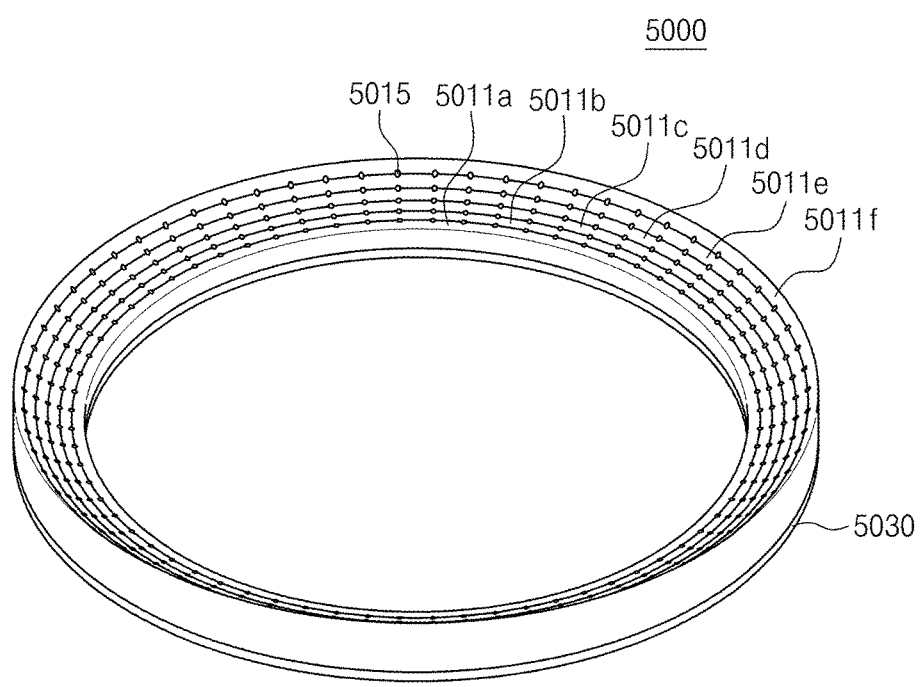
FIG. 2 is a perspective view of a baffle unit of FIG. 1.
Figure 3:
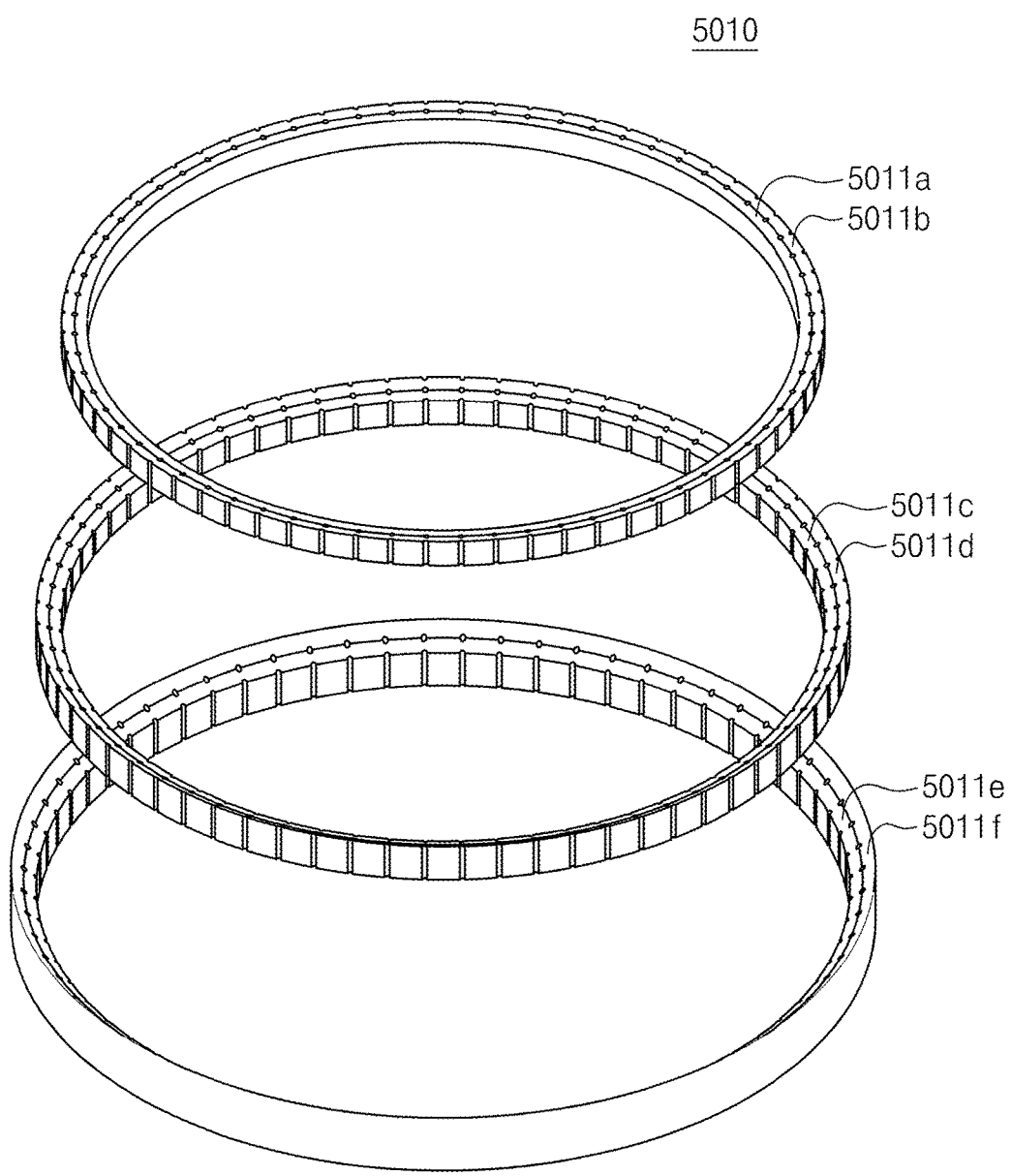
FIG. 3 is an exploded perspective view of a baffle of FIG. 2.
Figure 4:
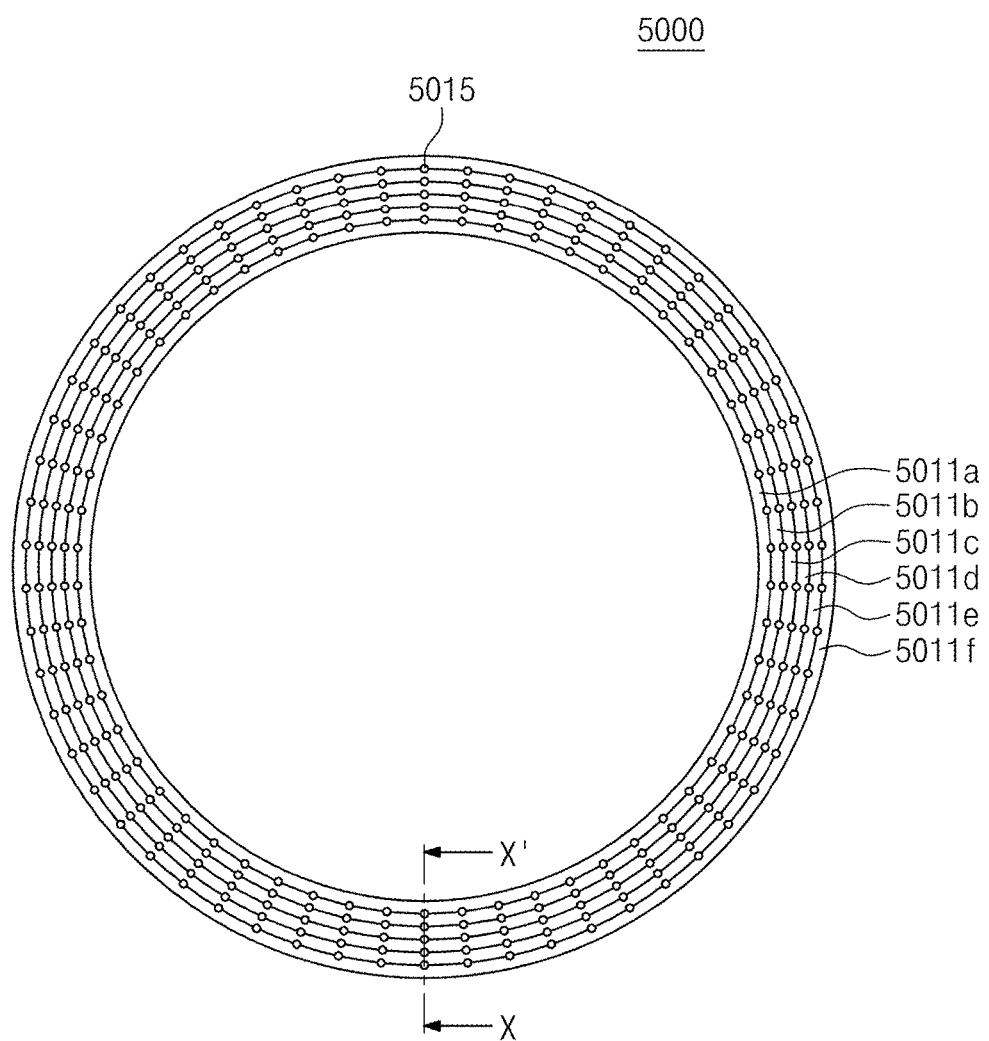
FIG. 4 is a plan view of a baffle unit of FIG. 2.
Figure 5:
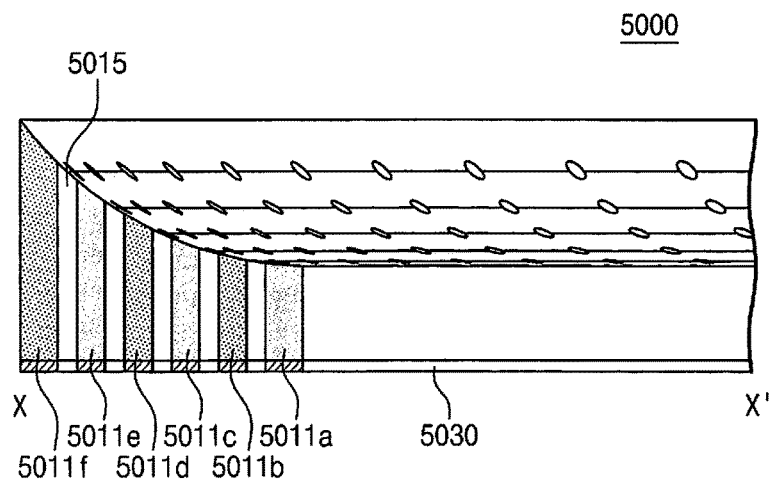
FIG. 5 is a cross-sectional view taken along line X-X' of FIG. 4.

FIG. 2 is a perspective view of a baffle unit of FIG. 1, FIG. 3 is an exploded perspective view of a baffle of FIG. 2, FIG. 4 is a plan view of a baffle unit of FIG. 2, and FIG. 5 is a cross-sectional view taken along line X-X' of FIG. 4.

Referring to FIGS. 2 to 5, a baffle unit 5000 includes a baffle 5010 and a baffle grounding plate 5030. The baffle unit 5000 controls a flow of the process gas supplied into the housing 110.

The baffle unit 5000 is disposed between the inner sidewall of the housing 110 and the support member 400. The baffle 5010 may have an annular ring shape. A plurality of through holes 5015 are defined in the baffle 5010. The process gas supplied into the housing 110 is exhausted through an exhaust hole 102 via the through holes 5015 of the baffle 5010. A flow of the process gas may be controlled according to a shape of the baffle 5010 and a shape of each of through holes 5011.

The baffle grounding plate 5030 contacts the baffle 5010. According to an embodiment, the baffle grounding plate 5030 may have a top surface contacting a bottom surface of the baffle 5010. The baffle grounding plate 5030 may have an edge area contacting the housing 110. The baffle 5010 is electrically connected to the housing 110 through the baffle grounding plate 5030.

The baffle 5010 has a plurality of areas 5011a to 5011f when viewed from an upper side. According to an embodiment, each of the areas 5011a to 5011f has a ring shape. Also, the areas 5011a to 5011f are concentrically disposed.

Here, each of portions 5011a, 5011c, and 5011e of the plurality of areas 5011a to 5011f is formed of a metallic material, and each of the other portions 5011b, 5011d, and 5011f is formed of a nonmetallic material. Aluminum may be provided as the metallic material. A dielectric substance may be provided as the nonmetallic material. Aluminum oxide may be used as the dielectric substance. The metallic material areas 5011a, 5011c, and 5011e and the nonmetallic material areas 5011b, 5011d, and 5011f may be alternately repeatedly provided. For example, the metallic material areas 5011a and 5011c may be disposed on both sides of the nonmetallic material area 5011b, and the nonmetallic material areas 5011b and 5011d may be disposed on both sides of the metallic material area 5011c.

A plurality of through holes 5015 may be defined in the baffle 5010. Each of the through holes 5015 may vertically pass through top and bottom surfaces of the baffle 5010. According to an embodiment, the through hole 5015 is defined in a boundary between each of the metallic material areas 5011a, 5011c, and 5011e and each of the nonmetallic material area 5011b, 5011d, and 5011f. The through holes 5015 may be defined along the boundary between each of the metallic material areas 5011a, 5011c, and 5011e and each of the nonmetallic material area 5011b, 5011d, and 5011f at a predetermined distance.

Portions of the plurality of areas 5011a to 5011f of the baffle 5010 may have thicknesses different from each other. According to an embodiment, each of the plurality of areas 5011a to 5011f may have a shape that gradually increases in thickness outward from a central portion thereof. For example, although the baffle 5010 has a bottom surface disposed in a horizontal direction, the baffle 5010 has a thickness gradually increasing because a top surface thereof gradually increases in height outward. Here, the top surfaces of the baffle 5010 may be combined with each other and be provided in a rounded shape. Alternatively, the top surfaces of the baffle 5010 may be combined into a set so that the baffle 5010 has a top surface upwardly inclined outward from the inside thereof. Alternatively, the baffle 5010 may have a bottom surface gradually increasing or decreasing in height outward.

Figure 6:
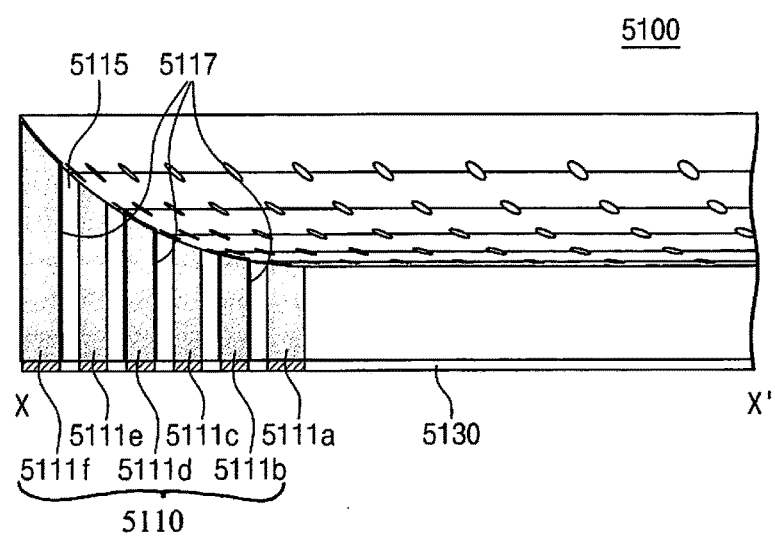
FIG. 6 is a cross-sectional view of a cutoff surface according to a modified example of the baffle unit of FIG. 2.

FIG. 6 is a cross-sectional view illustrating a cutoff surface according to a modified example of the baffle unit of FIG. 2.

Referring to FIG. 6, a baffle unit 5100 includes a baffle 5110 and a baffle grounding plate 5130. The baffle unit 5100 may have the same shape as the baffle unit 5000 of FIG. 2. On the other hand, each of areas 5111a to 5111f of the baffle 5110 is different in material from that of each of the areas 5011a to 5011f of the baffle 5010 of FIG. 2. Hereinafter, features different from those of the baffle unit 5000 of FIG. 2 will be mainly described.

Portions of the plurality of areas 5111a to 5111f of the baffle 5110 may have thicknesses different from each other. According to an embodiment, the baffle 5110 may be formed of a metallic material, and portions 5111b, 5111d, and 5111f of the plurality of areas 5111a to 5111f of the baffle 5110 may be coated with a nonmetallic material. In this case, the coated areas 5111b, 5111d, and 5111f and the non-coated areas 5111b, 5111d, and 5111f may be alternately repeatedly provided. Alternatively, the baffle 5110 may be formed of a nonmetallic material, and portions 5111a, 5111c, and 5111f of the plurality of areas 5111a to 5111f of the baffle 5110 may be coated with a metallic material.

Figure 7:
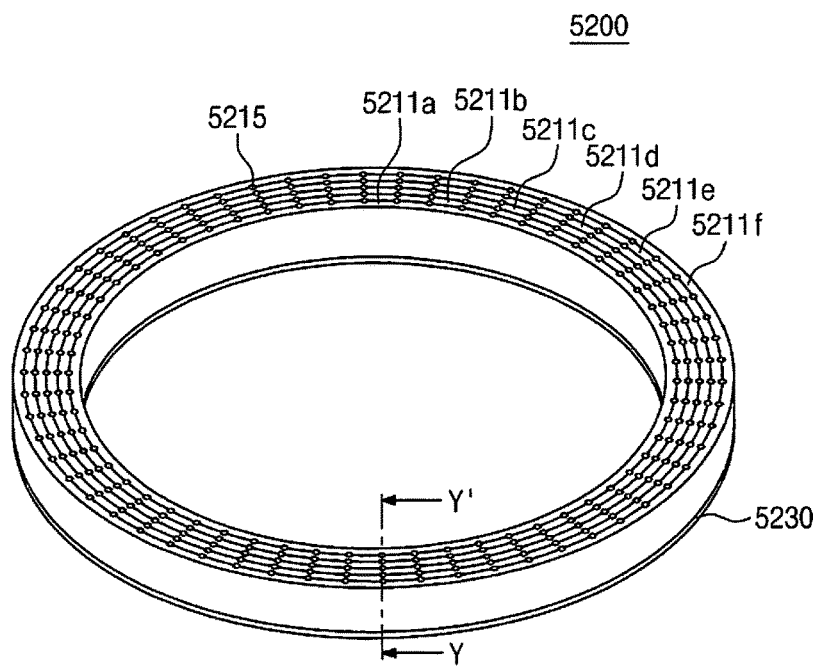
FIG. 7 is a perspective view of a baffle unit of FIG. 1 according to another embodiment.
Figure 8:
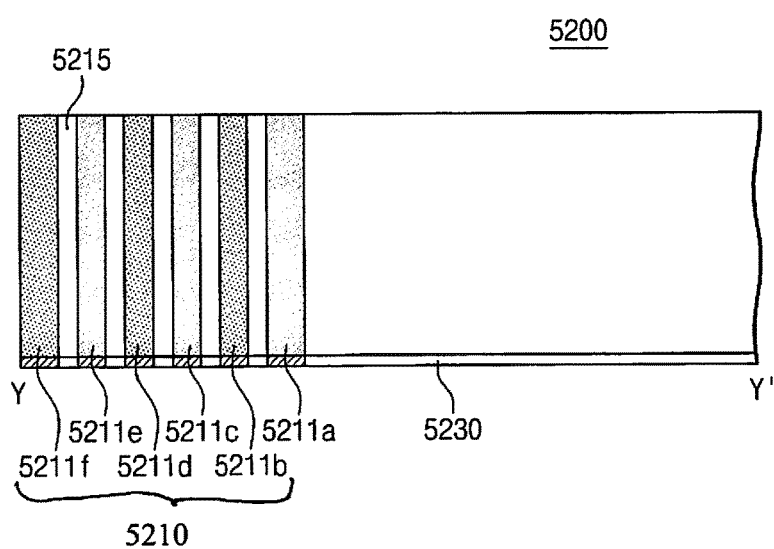
FIG. 8 is a cross-sectional view taken along line Y-Y' of FIG. 7.

FIG. 7 is a perspective view of a baffle unit of FIG. 1 according to another embodiment, and FIG. 8 is a cross-sectional view taken along line Y-Y' of FIG. 7.

Referring to FIGS. 7 and 8, a baffle unit 5200 includes a baffle 5210 and a baffle grounding plate 5230. In the baffle unit 5200, each of areas 5211a to 5211f of the baffle 5210 is different in thickness from that of each of the areas 5011a to 5011f of the baffle 5000 of FIG. 2. Since the baffle unit 5200 is the same as the baffle unit 5000 of FIG. 2 except for the above-described thickness, features different from those of the baffle unit 5000 of FIG. 2 will be mainly described.

The baffle 5210 has a plurality of areas 5211a to 5211f when viewed from an upper side. According to an embodiment, each of the areas 5211a to 5211f has a ring shape. Also, the areas 5211a to 5211f are concentrically disposed. Here, each of portions 5211a, 5211c, and 5211e of the plurality of areas 5211a to 5211f is formed of a metallic material, and each of the other portions 5211b, 5211d, and 5211f is formed of a nonmetallic material. Aluminum may be provided as the metallic material. A dielectric substance may be provided as the nonmetallic material. Aluminum oxide may be used as the dielectric substance. The metallic material areas 5211a, 5211c, and 5211e and the nonmetallic material areas 5211b, 5211d, and 5211f may be alternately repeatedly provided.

A plurality of through holes 5215 may be defined in the baffle 5210. Each of the through holes 5215 may vertically pass through top and bottom surfaces of the baffle 5210. According to an embodiment, the through hole 5215 is defined in a boundary between each of the metallic material areas 5211a, 5211c, and 5211e and each of the nonmetallic material area 5211b, 5211d, and 5211f. For example, each of the metallic material areas 5211a, 5211c, and 5211e may be disposed on one side of the through hole 5215, and each of the nonmetallic material areas 5211b, 5211d, and 5211f may be disposed on the other side of the through hole 5215. The through holes 5215 may be defined along a boundary between each of the metallic material areas 5211a, 5211c, and 5211e and each of the nonmetallic material area 5211b, 5211d, and 5211f at a predetermined distance.

The plurality of areas 5211a to 5211f of the baffle 5210 may have the same thickness. The baffle 5010 of FIG. 2 is different from the baffle 5210 according to the current embodiment in that the plurality of areas 5011a to 5011f of the baffle 5010 have thicknesses different from each other.

Although six areas are provided on the baffle in the above-described embodiment and the modified example, the present invention is not limited thereto. For example, six or more areas or six or less areas may be provided on the baffle.

Hereinafter, a process of treating a substrate by using the substrate treatment apparatus 10 of FIG. 1 will be described.

When a substrate W is placed on a support member 200, DC current is applied into a lower electrode 223 from a first lower power source 223a. An electrostatic force may act between the lower electrode 223 and the substrate W by the DC current applied into the lower electrode 223. Thus, the substrate W may be absorbed to an electrostatic chuck 210 by the electrostatic force.

When the substrate W is absorbed on the electrostatic chuck 210, a process gas is supplied into a housing 110 through a gas supply nozzle 310. Also, a high-frequency power generated in a plasma power source 430 is applied into the housing 110 through an antenna 420. The applied high-frequency power excite the process gas staying in the housing 110. The excited process gas is provided onto the substrate W to treat the substrate W. An etching process may be performed by using the excited process gas.

When the process gas supplied into the housing 110 is provided above the support member 200, the substrate treatment process may be improved in efficiency. However, since the process gas is exhausted through the baffle disposed adjacent to an edge area of the support member 200, the process gas may be relatively low in density in an edge region than a central region within the housing 110.

According to the current embodiment, the baffle 5010 has a thickness gradually increasing from a central area toward an edge area thereof. Thus, the process gas within the housing 110 may not be easily exhausted toward the edge region of the housing 110 and thus be moved toward the central region of the housing 110. Therefore, the process gas may be distributed with uniform density from the edge region to the central region above the support member 200. When the process gas is uniformly distributed above the support member 200, the plasma treatment may be uniformly performed over an entire area of the substrate W. As a result, the treatment of the substrate W may be improved in reliability.

Also, in a case where the whole baffle 5010 is formed of the metallic material, when the process gas is exhausted through the through holes 5015 of the baffle 5010, arcing may occur in the through holes 5015. Since a high-temperature high-pressure atmosphere is formed within the housing 110 due to the plasma treatment, and the through holes 5015 are surrounded by the baffle 5010 formed of the metallic material, the arching may occur.

However, according to the embodiments of the present invention, the baffle 5010 is divided into the plurality of areas 5011a to 5011f. Also, portions 5011a, 5011c, and 5011e of the areas 5011a to 5011f are formed of the metallic material, and the other portions 5011b, 5011d, and 5011f of the areas 5011a to 5011f are formed of the dielectric substance that is a nonmetallic material. Also, the through holes 5015 are defined in the boundary between each of the metallic material areas 5011a, 5011c, and 5011e and each of the nonmetallic material area 5011b, 5011d, and 5011f. Therefore, even though a physical distance between the through holes 5015 is constantly maintained, an electrical distance between the through holes 5015 may be widened. Since the through holes has the same diameter, and the physical distance is constantly maintained, the same amount of process gas may be exhausted, and also, a flow of the process gas may be controlled. However, since the distance between the metallic material areas is away from each other, the electrical distance between the through holes 5015 may be widened. Thus, the arcing occurring when the process gas passes through the through holes 5015 may be reduced. Therefore, the substrate treatment process may be improved in efficiency and reliability.

Figure 9:
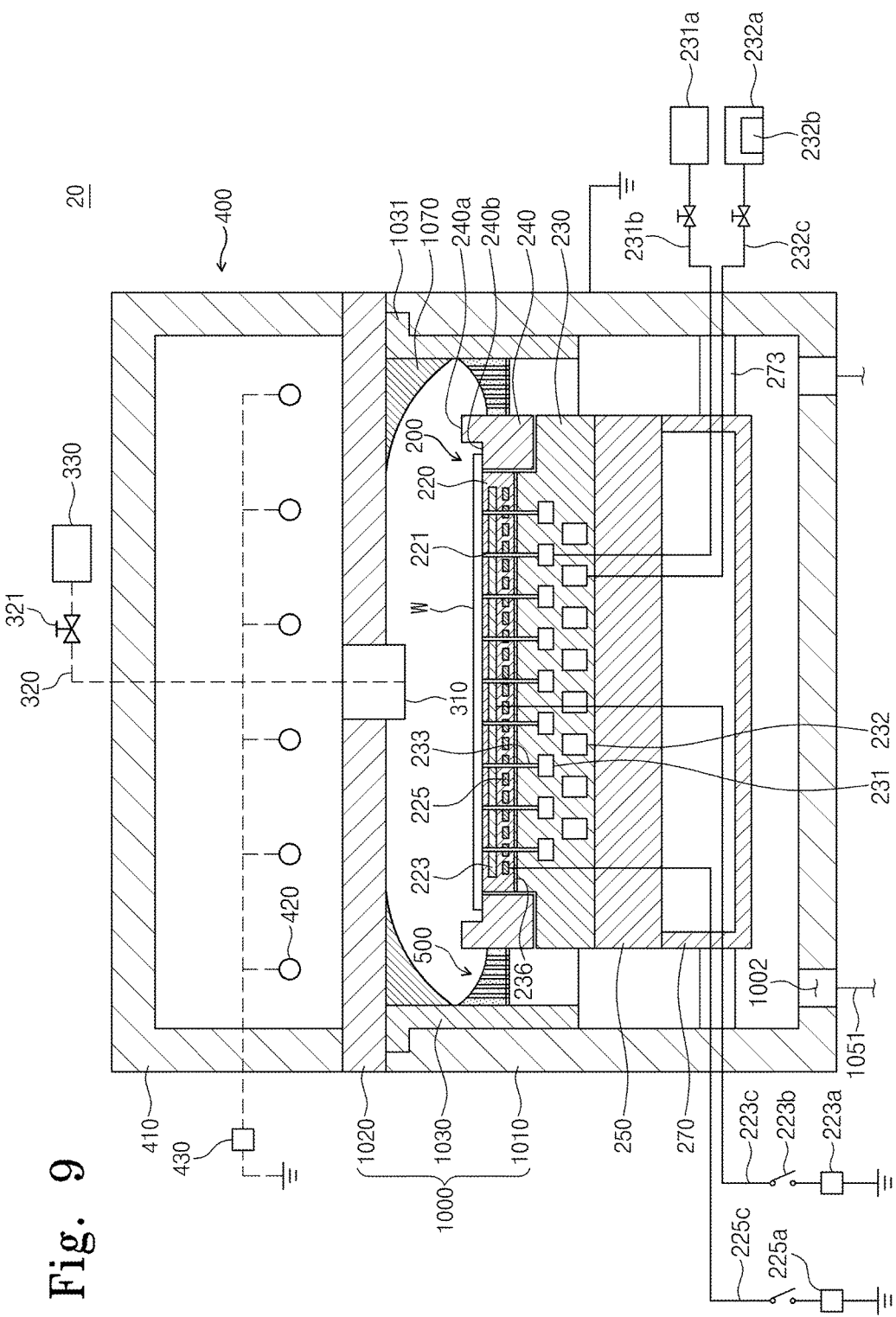
FIG. 9 is a cross-sectional view of a substrate treatment apparatus according to another embodiment of the present invention.

FIG. 9 is a cross-sectional view of a substrate treatment apparatus according to another embodiment of the present invention.

Referring to FIG. 9, a substrate treatment apparatus 20 includes a chamber 1000, a support member 200, a gas supply unit 300, a plasma source 400, and a baffle unit 500. The substrate treatment apparatus 20 according to the current embodiment is different from the substrate treatment apparatus 10 of FIG. 1 in configuration and function of a chamber 1000. The support member 200, the gas supply unit 300, the plasma source 400, and the baffle unit 500 except for the chamber 1000 have the same configuration and function as those of the substrate treatment apparatus 10 of FIG. 1. Thus, the chamber 1000 will be mainly described below. Also, other components except for the chamber 1000 are the same as those of the substrate treatment apparatus 10 of FIG. 1, and thus, their descriptions will be omitted.

The chamber 1000 provides a space in which a substrate treatment process is performed. The chamber 1000 includes a housing 1010, a sealing cover 1020, a liner 1030, and a plasma induction member 1070.

The housing 1010 has an inner space with an opened upper surface. The inner space of the housing 1010 is provided as a space in which the substrate treatment process is performed. The housing 1010 is formed of a metallic material. The housing 1010 may be formed of an aluminum material. An exhaust hole 1002 is defined in a bottom surface of the housing 1010. The exhaust hole 1002 is connected to an exhaust line 1051. Reaction byproducts generated during the process and gases staying in the housing 1010 may be exhausted to the outside through the exhaust line 1051. Also, the inner space of the housing 1010 is decompressed to a predetermined pressure by the exhausting process.

The sealing cover 1020 covers the opened upper surface of the housing 1010. The sealing cover 1020 may be provided in a plate shape to seal the inner space of the housing 1010. The sealing cover 1020 and the housing 1010 may be formed of materials different from each other. According to an embodiment, the sealing cover 1020 may include a dielectric substance window.

The liner 1030 is disposed within the housing 1010. The liner 1030 has an inner space with opened top and bottom surfaces. The liner 1030 may have a cylindrical shape. The liner 1030 may have a radius corresponding to that of an inner surface of the housing 1010. The liner 1030 may be disposed along the inner surface of the housing 1010. A support ring 1031 is disposed on an upper end of the liner 1031. The support ring 1031 may be provided as a plate having a ring shape. The support ring 1031 protrudes outward from the liner 1030 along a circumference of the liner 130. The support ring 1031 is disposed on an end of the upper housing 1010 to support the liner 1030. The liner 1030 and the housing 1010 may be formed of the same material. The liner 1030 may be formed of an aluminum material. The liner 1030 protects the inner surface of the housing 1010. When a process gas is excited, arc discharge may occur within the chamber 1000. The arc discharge may damage peripheral devices. The liner 1030 may protect the inner surface of the housing 1010 to prevent the inner surface of the housing 1010 from being damaged by the arc discharge. The liner 1030 may be inexpensive in manufacturing cost and easily replaced when compared to those of the housing 1010. When the liner 1030 is damaged by the arc discharge, the damaged liner 130 may be replaced with a new liner 130.

The plasma induction member 1070 is disposed on the top surface of the housing 1010. According to an embodiment, the plasma induction member 1070 may have a shape that gradually increases in thickness outward from a central portion thereof. For example, a top surface of the plasma induction member 1070 contacting the sealing cover 1020 may be provided as a horizontal surface. Also, the plasma induction member 1070 may have a bottom surface gradually decreasing in height spaced from the bottom surface of the housing 1010. The plasma induction member 1070 may have the bottom surface with a rounded shape.

The plasma induction member 1070 induces the process gas within the housing 1010 into an upper side of the support member 200. The process gas in the upper side of the support member 200 may increase in density. Also, the plasma treatment may be uniformly performed over an entire region of the support member 200. As a result, the treatment of the substrate W through the plasma may be improved in efficiency. The plasma induction member 1070 may be adjusted in position or thickness to adjust the density of the process gas within the housing 1010. Alternatively, the plasma induction member 1070 may not be provided.

Although the etching process is performed by using the plasma in the above-described embodiments, the substrate treatment process according to the present invention is not limited thereto. For example, the substrate treatment process according to the present invention may be applied to various substrate treatment processes using the plasma, for example, a deposition process, an ashing process, and a cleaning process.

According to the embodiments of the present invention, the plasma within the chamber may be concentrated into the central region in which the substrate is disposed in the substrate treatment process using the plasma.

Also, according to the embodiments of the present invention, when the fluid is exhausted into the chamber through the baffle, the occurrence of the arcing may be prevented.

The feature of the present invention is not limited to the aforesaid, but other features not described herein will be clearly understood by those skilled in the art from this specification and the accompanying drawings.

The above-disclosed subject matter is to be considered illustrative, and not restrictive, and the appended claims are intended to cover all such modifications, enhancements, and other embodiments, which fall within the true spirit and scope of the present invention. Therefore, to explain the embodiments disclosed in the present invention is not limited to the technical idea of the present invention, and are not limited by this embodiment without departing from the scope or spirit of the invention. The scope of protection of the present invention, all the technical idea, within the scope of its equivalent shall be construed by the following claims should be construed as being included in the scope of the present invention.

What is claimed is:

1. A substrate treatment apparatus comprising:
   a housing having an inner space configured to receive a substrate;
   a support member within the housing to support the substrate;
   a gas supply unit configured to supply a gas into the housing;
   a plasma source configured to generate plasma from the gas supplied into the housing; and
   a baffle unit surrounding the support member within the housing, the baffle unit comprising a baffle in which through holes for exhausting the gas in the inner space of the housing are defined,
   wherein the baffle is divided into a plurality of rings of metallic material and a plurality of rings of nonmetallic material,
   wherein the plurality of rings of metallic material and the plurality of rings of nonmetallic material are concentric, horizontally adjacent, and non-overlapping when viewed from an upper side, and individual rings from among the plurality of rings of metallic material alternate with individual rings from among the plurality of rings of nonmetallic material,
   wherein the through holes are defined in a boundary between each of the plurality of rings of metallic material and the plurality of rings of nonmetallic material,
   wherein top surfaces of the baffle unit have a rounded shape or are upwardly inclined outward from a central area to an edge area thereof; and
   wherein each of the plurality of rings of nonmetallic material is a solid material.

2. The substrate treatment apparatus of claim 1, wherein rings from among the plurality of rings of metallic material are on both sides of each ring from among the plurality of rings of nonmetallic material.

3. The substrate treatment apparatus of claim 1, wherein portions of the plurality of rings of metallic material and the plurality of rings of nonmetallic material have thicknesses different from each other.

4. The substrate treatment apparatus of claim 1, wherein each ring from among the plurality of rings of metallic material and the plurality of rings of nonmetallic material has a thickness gradually increasing from a central area to an edge area thereof.

5. The substrate treatment apparatus of claim 1, wherein the nonmetallic material comprises a dielectric substance.

6. The substrate treatment apparatus of claim 5, wherein the baffle unit further comprises a baffle grounding plate having a top surface contacting a bottom surface of the baffle, the baffle grounding plate being connected to the housing to ground the baffle.

7. A baffle unit comprising:
a baffle defining through holes for exhausting a gas in a space configured to receive a substrate;
a grounding plate contacting the baffle to ground the baffle,
wherein the baffle is divided into a plurality of horizontally adjacent rings when viewed from an upper side, and
each individual horizontally adjacent ring alternates between solid metallic material and solid nonmetallic material,
wherein a plurality of rings of the metallic material from among the plurality of horizontally adjacent rings and a plurality of rings of the nonmetallic material from among the plurality of horizontally adjacent rings are concentric, and non-overlapping when viewed from an upper side,
wherein the through holes are defined in a boundary between each of the plurality of rings of the metallic material and the plurality of rings of the nonmetallic material,
wherein top surfaces of the baffle have a rounded shape or are upwardly inclined outward from a central area to an edge area thereof; and
wherein each of the plurality of rings of nonmetallic material is a solid material.

8. The baffle of claim 7, wherein portions of the plurality of horizontally adjacent rings have thicknesses different from each other.

9. The baffle of claim 7, wherein each of the plurality of horizontally adjacent rings has a thickness gradually increasing from a central area to an edge area thereof.

10. The substrate treatment apparatus of claim 1, wherein an entry portion and an exit portion of the through holes are within the housing.

11. The baffle unit of claim 7, wherein an entry portion and an exit portion of the through holes are within the space configured to receive the substrate.

12. A substrate treatment apparatus comprising:
a housing having an inner space configured to receive a substrate;
a support member within the housing to support the substrate;
a gas supply unit configured to supply a gas into the housing;
a plasma source configured to generate plasma from the gas supplied into the housing; and
a baffle unit surrounding the support member within the housing, the baffle unit comprising a baffle in which through holes for exhausting the gas in the inner space of the housing are defined,
wherein the baffle is divided into a plurality of horizontally adjacent non-overlapping rings when viewed from an upper side, and each individual horizontally adjacent non-overlapping ring alternates between solid metallic material and solid non-metallic material; and
wherein each of the plurality of rings of nonmetallic material is a solid material.

* * * * *